United States Patent
Xu et al.

(10) Patent No.: US 9,431,216 B2
(45) Date of Patent: Aug. 30, 2016

(54) ICP SOURCE DESIGN FOR PLASMA UNIFORMITY AND EFFICIENCY ENHANCEMENT

(71) Applicant: Advanced Micro-Fabrication Equipment Inc, Shanghai, Shanghai (CN)

(72) Inventors: Songlin Xu, Shanghai (CN); Gang Shi, Shanghai (CN); Tuqiang Ni, Shanghai (CN)

(73) Assignee: ADVANCED MICRO-FABRICATION EQUIPMENT INC, SHANGHAI, Shanghai (CN)

( * ) Notice: Subject to any disclaimer, the term of this patent is extended or adjusted under 35 U.S.C. 154(b) by 120 days.

(21) Appl. No.: 14/066,631

(22) Filed: Oct. 29, 2013

(65) Prior Publication Data

US 2014/0120731 A1    May 1, 2014

Related U.S. Application Data

(63) Continuation-in-part of application No. 13/337,248, filed on Dec. 26, 2011, now Pat. No. 9,095,038.

(30) Foreign Application Priority Data

Oct. 19, 2011  (CN) .......................... 2011 1 0319250
Oct. 19, 2011  (CN) .......................... 2011 1 0319252
Nov. 1, 2012   (CN) .......................... 2012 1 0431839

(51) Int. Cl.
H01L 21/306   (2006.01)
C23C 16/00    (2006.01)
H01J 37/32    (2006.01)

(52) U.S. Cl.
CPC ........ *H01J 37/321* (2013.01); *H01J 37/32449* (2013.01); *H01J 37/32633* (2013.01)

(58) Field of Classification Search
CPC ............... H01J 37/321; H01J 37/3211; H01J 37/32119; H01J 37/32128; H01J 37/32137; H01J 37/32146; H01J 37/32155; H01J 37/32165; H01J 37/32174; H01J 37/32183; H01J 37/32633; H01J 37/32623; H01J 37/32642; H01J 37/32651
USPC .................. 118/723 I, 723 IR, 723 AN, 504; 156/345.48, 345.49, 345.3; 315/111.51
See application file for complete search history.

(56) References Cited

U.S. PATENT DOCUMENTS

2003/0047536 A1*  3/2003  Johnson .......................... 216/67
2008/0099426 A1*  5/2008  Kumar et al. ................... 216/12

FOREIGN PATENT DOCUMENTS

JP    07-029890 A     1/1995
KR    10-0864111 B1   10/2008

OTHER PUBLICATIONS

Notice of Preliminary Rejection for Korean Patent Application No. 10-2013-0130035 dated Aug. 28, 2014.

*Primary Examiner* — Luz Alejandro Mulero
(74) *Attorney, Agent, or Firm* — Nixon Peabody LLP; Joseph Bach, Esq.

(57) ABSTRACT

An ICP A plasma reactor having an enclosure wherein at least part of the ceiling forms a dielectric window. A substrate support is positioned within the enclosure below the dielectric window. An RF power applicator is positioned above the dielectric window to radiate RF power through the dielectric window and into the enclosure. A plurality of gas injectors are distributed uniformly above the substrate support to supply processing gas into the enclosure. A circular baffle is situated inside the enclosure and positioned above the substrate support but below the plraity of gas injectors so as to redirect the flow of the processing gas.

8 Claims, 7 Drawing Sheets

ICP SOURCE DESIGN FOR PLASMA UNIFORMITY AND EFFICIENCY ENHANCEMENT

RELATED APPLICATIONS

This application is a continuation-in-part application of U.S. patent application Ser. No. 13/337,248, filed on Dec. 26, 2011, which claims priority to Chinese Patent Application Nos. 201110319252.7 filed on Oct. 19, 2011 and 201110319250.8 filed on Oct. 19, 2011. This application also claims priority to Chinese Patent Application No. 201210431839.1 filed on Nov. 1, 2012, the entireties of which are incorporated herein by reference.

FIELD

The subject invention relates to plasma reactors and, especially to uniform gas distribution in inductively-coupled plasma reactors.

RELATED ART

Plasma reactors or chambers are well known in the art and are widely used in the fabrication of semiconductor integrated circuits, flat panel displays, light emitting diodes, solar cells, etc. In a plasma chamber it is conventional to apply an RF power to ignite and sustain the plasma inside the vacuum chamber. There are various manners in which the RF power can be applied, and each manner has different characteristics, e.g., efficiency, plasma dissociation, uniformity, etc. One technology that is relevant to this disclosure is inductively-coupled plasma (ICP) chambers.

In inductively-coupled plasma processing chambers, an antenna, usually in the form of a coil, is used to transmit the RF power into the chamber. In order to couple the RF power from the antenna into the chamber, a dielectric window is provided at the location where the antenna is situated. In chambers for processing substrates, e.g., silicon wafers, the substrate is situated on a chuck and the plasma is generated above the substrate. Therefore, the antenna is positioned over the ceiling of the chamber, such that the ceiling is made of a dielectric material or includes a dielectric window.

In the plasma processing chamber, various gasses are injected into the chamber so that chemical and/or physical interaction of ions with the substrate can be used to generate various features on the substrate by, e.g., etching, depositing, etc. In many such processes, one parameter of high importance is within-wafer processing uniformity. That is, a process occurring at the center of the substrate should be of identical or highly similar characteristics as the process occurring at the edge of the substrate. Thus, for example, when performing an etching process, the etching rate at the center of the wafer should be the same as that at the edge of the wafer.

One parameter that helps in achieving good processing uniformity is even distribution of the processing gas within the chamber. To achieve such uniformity, many chamber designs employ a showerhead situated above the wafer to uniformly inject the processing gas. However, as noted above, in ICP chambers, the ceiling must include a window for the RF power transmitted by the antenna. Consequently, such design does not lend itself to showerhead implementation of gas injection.

Figure 1:
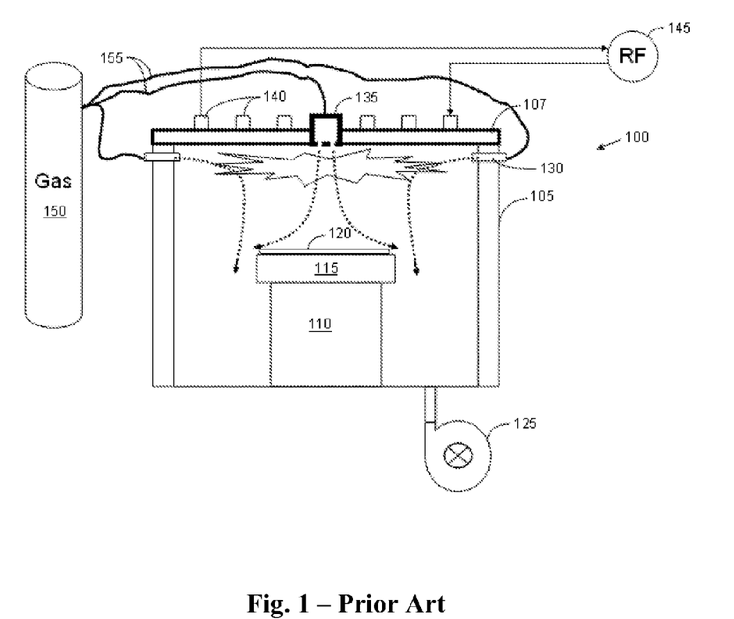
FIG. 1 is a schematic cross-section of a prior art ICP processing chamber.

FIG. 1 illustrates a cross-section of a prior art ICP chamber design. An ICP chamber 100 has a generally cylindrical metallic sidewall 105 and a dielectric ceiling 107, forming a tight vacuum enclosure that is pumped by a vacuum pump 125. A pedestal 110 supports a chuck 115, which holds a wafer 120 to be processed. The RF power from an RF power supplier 145 is applied to antennas 140, which is generally in the form of a coil. Processing gas is supplied from a gas source 150 via pipelines 155 into the chamber to ignite and sustain plasma, and thereby process the wafer 120. In standard ICP chambers, the gas is supplied into the vacuum enclosure either by circumference injectors/nozzles 130, by a central nozzle 135, or both.

As can be appreciated from FIG. 1, the gas from the circumference injectors 130 is largely pumped out and is not effectively dissociated to reach the surface of the wafer 120. Thus, much of the gas from the circumference injectors 130 may be processed at the edge of the wafer, but little reaches the center of the wafer 120, leading to non-uniformity. Conversely, the gas provided from the central nozzle 135 is concentrated at the center of the wafer and is not used at the edge of the wafer, also leading to non-uniformity.

Accordingly, there is a need in the art for an improved ICP chamber design that improves the gas distribution within the chamber to provide enhanced processing uniformity.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to more detailed description that is presented below.

According to an aspect of the invention, a plasma reactor is provided that includes an enclosure, a dielectric window, an RF antenna provided over the dielectric window, a plurality of gas injectors to supply gas into the enclosure, and a baffle situated within the enclosure to constrict and/or redirect the flow of the gas exiting form the injectors.

According to another aspect of the invention an ICP plasma reactor is provided, having an enclosure wherein at least part of the ceiling forms a dielectric window. A substrate support is positioned within the enclosure below the dielectric window. An RF power applicator is positioned above the dielectric window to radiate RF power through the dielectric window and into the enclosure. A plurality of gas injectors are distributed uniformly above the substrate support to supply processing gas into the enclosure. A circular baffle is situated inside the enclosure and positioned above the substrate support but below the plurality of gas injectors so as to redirect the flow of the processing gas.

According to another aspect of the invention, the baffle may be formed of a conductive or dielectric material. For example, the baffle may be fabricated of anodized aluminum, of ceramic, of quartz, etc.

According to yet another aspect of the invention, the baffle may be formed as a circular disk with a central opening. The baffle may also have secondary openings distributed around the central opening. The baffle may have an extension extending from the central opening. The extension may be formed as a cylindrical section, a conical section, etc. The baffle may incorporate an RF antenna therein. The baffle may be vertically movable so as to be raised or lowered over the substrate support, thereby varying the gap over the substrate.

According to a further aspect of the invention, a method of fabricating a semiconductor device on a substrate is provided, including placing the substrate on a substrate support positioned within a plasma reactor, wherein the plasma reactor comprises an enclosure having a cylindrical sidewall and a ceiling, wherein at least part of the ceiling forms a dielectric window, an RF power applicator is positioned above the dielectric window to radiate RF power through the dielectric window and into the enclosure, and a plurality of gas injectors are distributed uniformly above the substrate; positioning a circular baffle inside the enclosure such that the baffle is above the substrate support but below the plurality of gas injectors so as to define a gap above the substrate; supplying the processing gas to the injectors; and, applying RF power to the RF power applicator.

BRIEF DESCRIPTION OF THE DRAWINGS

The accompanying drawings, which are incorporated in and constitute a part of this specification, exemplify embodiments of the present invention and, together with the description, serve to explain and illustrate principles of the invention. The drawings are intended to illustrate major features of exemplary embodiments in a diagrammatic manner. The drawings are not intended to depict every feature of actual embodiments nor relative dimensions of depicted elements, and are not drawn to scale.

DETAILED DESCRIPTION

Embodiments of the invention relate to an inductively-coupled plasma chamber having improved uniformity, especially gas distribution uniformity. Within-wafer uniformity is improved by the embodiments of the invention wherein provisions are made to redirect gas injected by injectors and/or nozzles so as to improve the gas distribution within the chamber.

Figure 2:
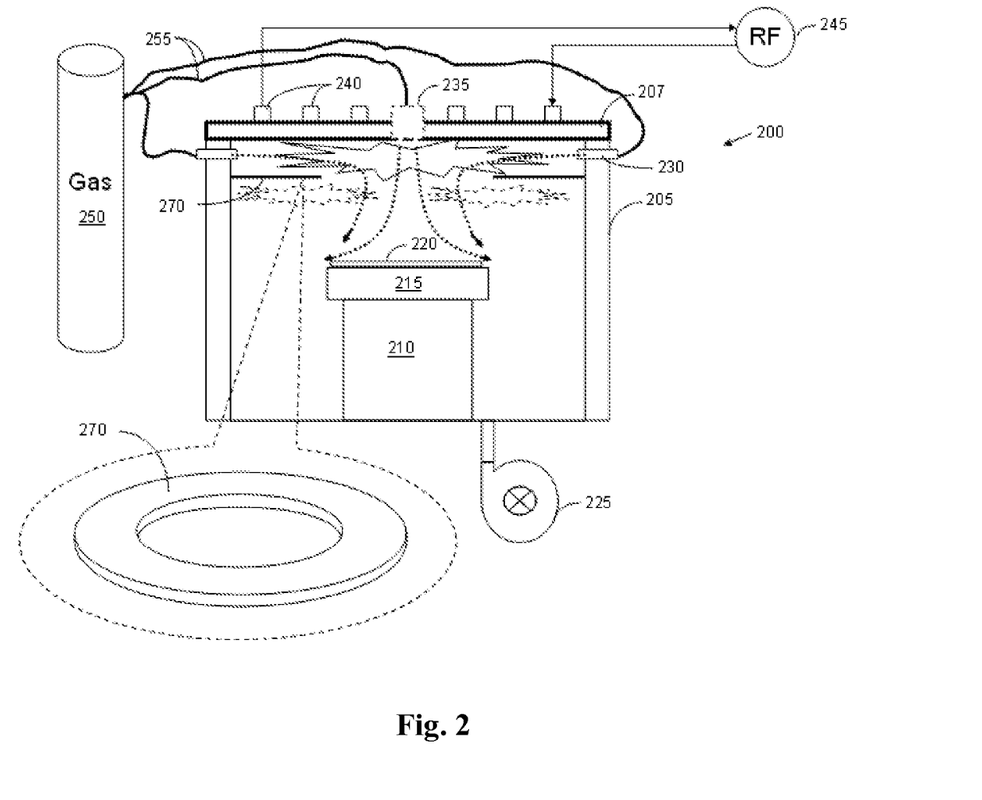
FIG. 2 is a schematic cross-section of an ICP processing chamber according to an embodiment of the invention.

Here an embodiment of the invention is described in detail with reference to FIG. 2. FIG. 2 illustrates a plasma processing apparatus 200 according to one embodiment of the invention. Elements illustrated in FIG. 2 which correspond to the elements illustrated in FIG. 1 are given with the same reference numbers, except that they are in the 2xx series. It will be appreciated that the apparatus 200 is merely exemplary and that the apparatus 200 may include fewer or additional components and the arrangement of the components may differ from that illustrated in FIG. 2.

FIG. 2 illustrates a cross-section of an ICP chamber design implementing a gas diversion feature according to one embodiment of the invention. ICP chamber 200 has a metallic sidewall 205 and a dielectric ceiling 207, forming a tight vacuum enclosure that is pumped by a vacuum pump 225. The dielectric ceiling 207 is provided only as one example, but other ceilings can be used, e.g., a dome ceiling, a metallic ceiling with a dielectric window, etc. A pedestal 210 supports a chuck 215, which holds a substrate 220 to be processed. A bias power is generally applied to the chuck 215, but is not shown in FIG. 2, as it is not pertinent to the disclosed embodiment. The RF power from an RF power supplier 245 is applied to antennas 240, which is generally in the form of a coil.

Processing gas is supplied from a gas source 250 via pipelines 255 into the chamber to ignite and sustain plasma, and thereby process the substrate 220. In this embodiment, the gas is supplied into the vacuum enclosure by circumference injectors or nozzles 230, but additional gas may optionally injected via a central nozzle 235. If the gas is supplied from both the injectors 230 and the nozzle 235, the amount of the gas supplied from each may be arranged to be independently controlled. Any of these arrangements for injecting the gas may be referred to as plasma gas injector arrangement. In FIG. 2, a baffle 270 is situated within the chamber so as to restrict and/or redirect the flow of the gas emanating from the injectors 230. As shown in the callout, in this embodiment the baffle is generally in the form of a disk with a central hole or opening. The baffle is positioned below a gas injection point, but above the level of the substrate. In this manner, the gas is restricted to flow further towards the center of the chamber before it can flow downwards towards the substrate, as shown by dotted-line arrows.

In general, the baffle 270 may be made of a metallic material, such as anodized aluminum. Fabricating the baffle from metallic material may be advantageously employed to restrict the plasma to the area above the baffle, as the RF from a coil will be blocked by the baffle. On the other hand, the baffle 270 may be fabricated of a dielectric material, such as ceramic or quartz. In an embodiment using a dielectric baffle the RF from the coil may pass through the baffle, such that plasma may be maintained below the baffle (illustrated in broken-lines), depending on the amount of the gas reaching below the baffle.

Figure 3:
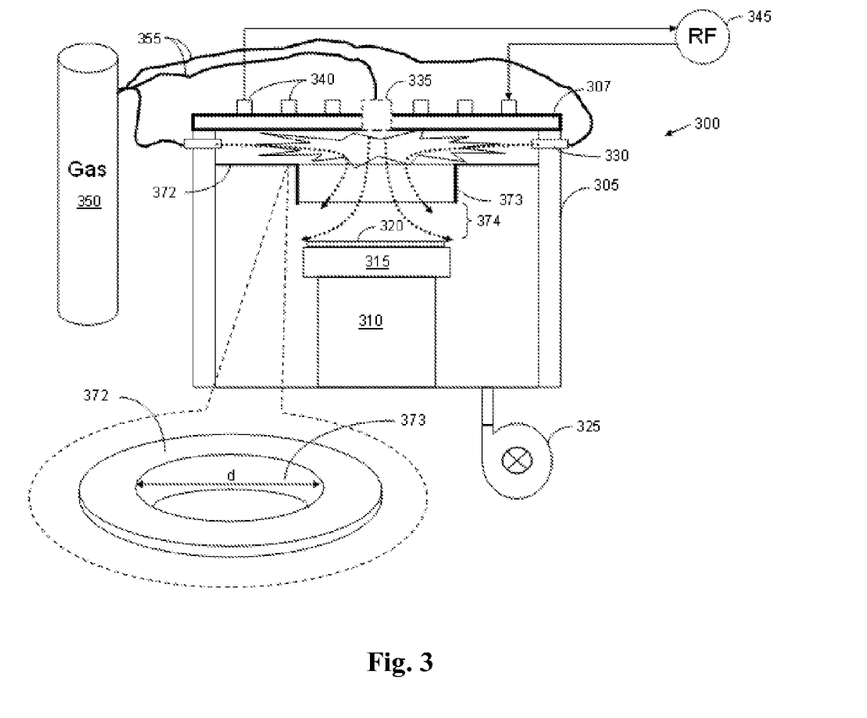
FIG. 3 is a schematic cross-section of an ICP processing chamber according to another embodiment of the invention.

In some circumstances it may be needed to further restrict the gas flow and cause the gas to spend more time over the center of the wafer to ensure full dissociation over the wafer. An embodiment beneficial for such applications is illustrated in FIG. 3. The elements of FIG. 3 that are similar to those of FIG. 2 are noted with the same reference numbers, except in the 3xx series. As shown in FIG. 3 and the callout of FIG. 3, the baffle 372 of this embodiment is made in the shape of a disk having a vertical ring extension 373, generally in the shape of a cylindrical section. The vertical extension creates a gap 374 through which the gas can flow to the side, i.e., to the area of the chamber beyond the circumference of the substrate. The size of the gap 374 determines the flow of the gas above the substrate and the time the gas spends above the substrate so as to be dissociated by the plasma.

In the embodiment shown in FIG. 3, the diameter of the ring opening, d, may be sized to equal the diameter of the substrate, or be larger or smaller than the diameter of the substrate. The diameter of the opening can be set depending on a desired flow restriction. Also, since the vertical ring extension is set to be orthogonal to the disk, the diameter at the opening of the ring extension 373 is the same as the diameter at the opening of the ring 372 itself.

Figure 4:
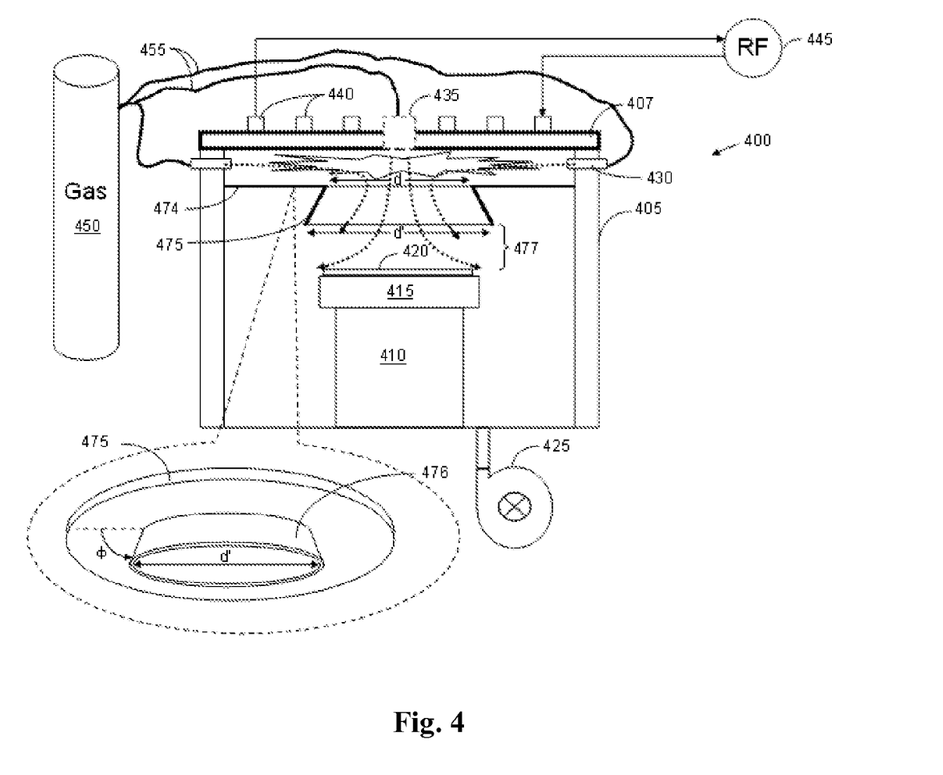
FIG. 4 is a schematic cross-section of an ICP processing chamber according to another embodiment of the invention.

On the other hand, sometimes it is desirable to restrict the exit of the gas from the ring towards the substrate, but once the gas flows towards the substrate it is sometimes desirable to enhance the flow in the horizontal direction towards the periphery of the chamber. An arrangement beneficial for such situations is illustrated in FIG. 4. In FIG. 4 a baffle 475 is structured of a ring with a conical-section extension 476. The conical-section 476 has an upper opening diameter d, which is smaller than a lower opening diameter d', wherein the lower opening is in close proximity to the substrate. The lower opening is positioned so as to define gap 477, through which gas flows horizontally towards the wall of the chamber. The sidewall of the conical section makes an angle $\phi$ with the ring, the angle $\phi$ being less than 90 degrees.

Figure 5:
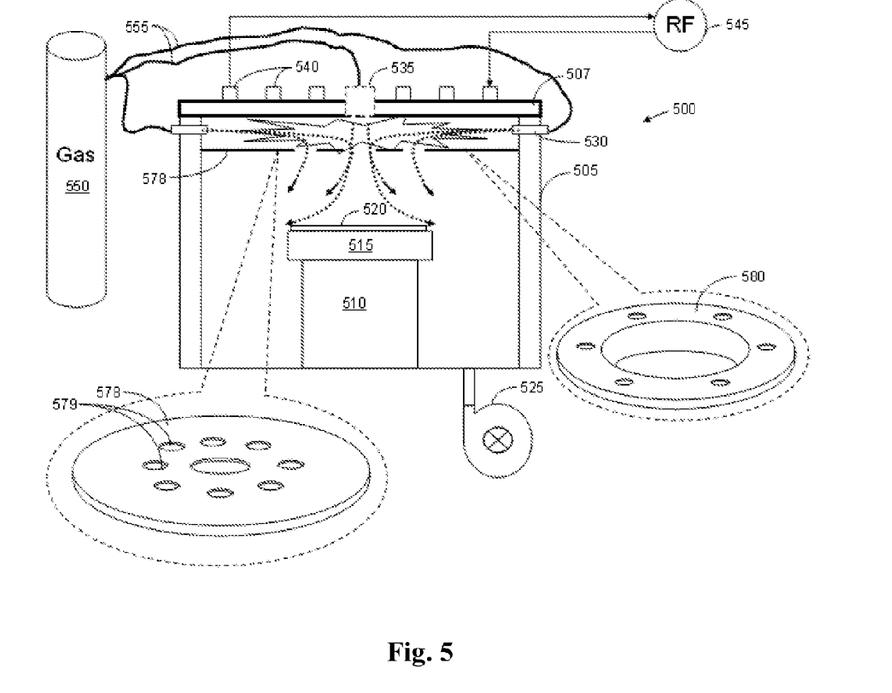
FIG. 5 is a schematic cross-section of an ICP processing chamber according to another embodiment of the invention.

In any of the above embodiments it may be desirable to let some gas flow out prior to it reaching the central opening of the baffle. FIG. 5 illustrates an embodiment that is somewhat of a modification of the embodiment of FIG. 2. As shown in FIG. 5, a baffle 578 is in the shape of a disk with a central opening, somewhat similar to the baffle 272 of FIG. 2. The central opening may be of the same or different diameter as that of FIG. 2. In addition, auxiliary or secondary openings 579 are provided about the central opening, so as to enable some gas to escape prior to reaching the central opening. The secondary openings may be of smaller diameters than the central opening. The auxiliary openings can be applied to any of the embodiments shown above, and may be distributed evenly around the central opening. For example, the second callout in FIG. 5 illustrates a modified baffle 580 that is similar to that illustrated in FIG. 3, except that the auxiliary openings have been added around the extension to enable some gas to flow out prior to reaching the central opening and flowing into the extension.

In the embodiments disclosed above, the baffle is used to control the flow of the processing gas. Additionally, the baffle can be used to passively control the plasma. In general, the plasma can diffuse through the holes on the baffle to the lower portion of the chamber. The larger the holes, the higher the plasma density becomes. By changing the number and locations of the holes, the plasma density distribution within the chamber can also be changed. The baffle can also be used to actively control the plasma. Such an example is illustrated in FIG. 6.

Figure 6:
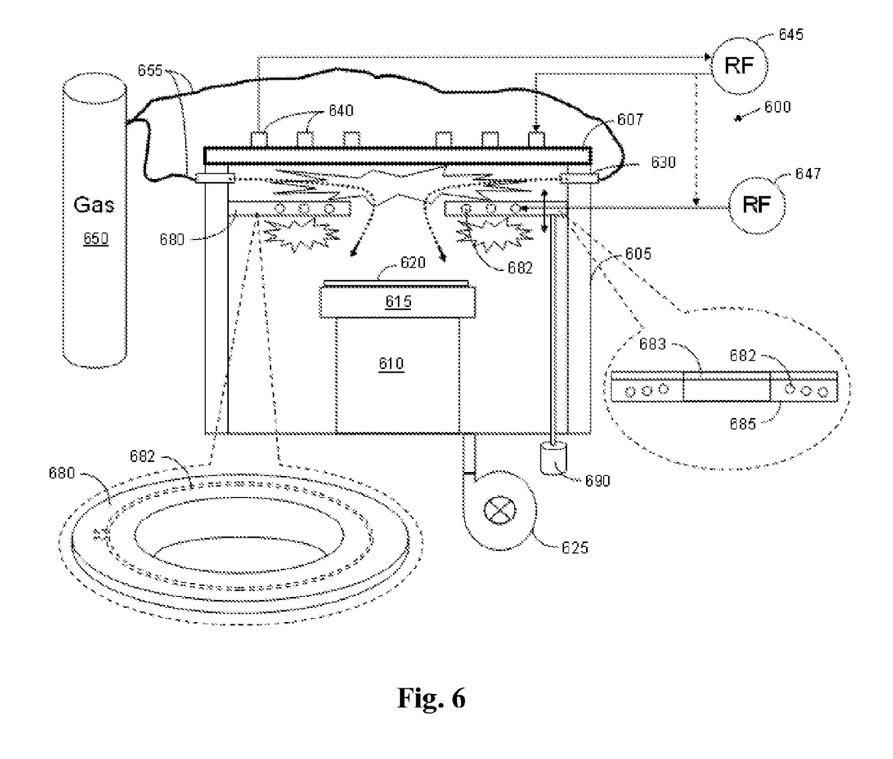
FIG. 6 is a schematic cross-section of an ICP processing chamber according to another embodiment of the invention.

In the embodiment of FIG. 6, a baffle 680 is used to actively control the plasma. As illustrated, a secondary antenna 682 is embedded within the baffle 680. The secondary antenna may be in the form of a coil. In the example shown in the callout the antenna is in the form of a single loop (shown in broken line), but other designs may be employed. The secondary antenna may be energized using a same power supplier 645 as a main antenna (illustrated as broken-line arrow), or it my be energized from a different RF power supplier 647. Regardless of the power supplier used, the amplitude of the power applied to the secondary antenna or coil 682 may be controlled independently of the power applied to the main antenna 640.

According to one embodiment, the baffle 680 is made of a dielectric material and the coil is embedded within the dielectric. For example, the baffle 680 may be made by sintering a ceramic material with a metallic coil embedded within the ceramic. In this manner, the power from the secondary coil is applied to the plasma above the baffle and to the plasma below the baffle. On the other hand, according to another embodiment, the baffle 680 is made with a dielectric on one side and a conductor on the other side, such that the RF power applies only to one side of the baffle. For example, the top of the baffle 680 may be made of a conductive material, so that the RF power from the secondary coil 682 is applied only to the plasma below the baffle. Such an arrangement is illustrated in the second callout of FIG. 6, wherein the coil 682 is embedded within a ceramic disk 685 such that the RF energy from the coil can be applied to the plasma below the baffle, but a conductive disk 683 is provided on top of the ceramic disk 685, such that the energy from the coil 682 cannot be applied to the plasma above the baffle. Additionally, in such an arrangement the baffle also blocks the RF power from the main antenna 640 from being applied to the plasma below the baffle 680. Consequently, the RF power to the main antenna 640 can be tailored (e.g., frequency, power, etc.) to control the plasma above the baffle 680, while the RF power to the secondary antenna 680 can be tailored to control the plasma below the baffle.

Any of the above embodiments can be further modified by making the baffle movable. Such an arrangement is schematically illustrated in FIG. 6. In FIG. 6 a step motor 690 is coupled to the baffle 680 by, e.g., rack and pinion arrangement, such that the step motor 690 can be energized to move the baffle vertically so as to lower or raise the baffle 680, such that the gap between the baffle 680 and a substrate 620 can be changed.

Figure 7:
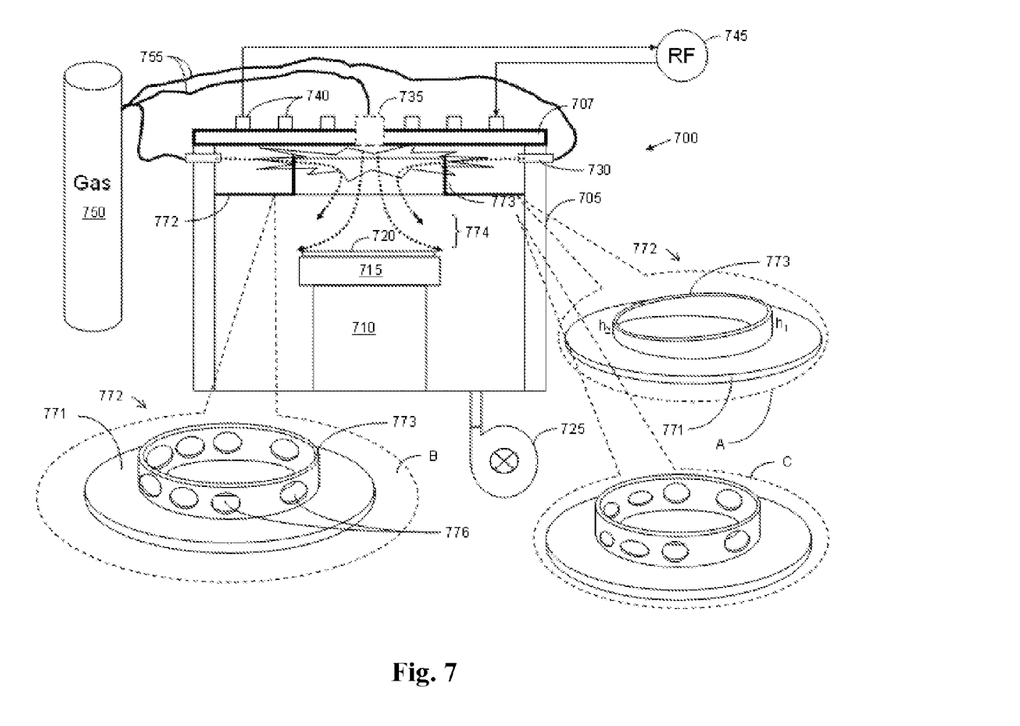
FIG. 7 is a schematic cross-section of an ICP processing chamber according to another embodiment, designed to overcome radial-asymmetry.

FIG. 7 is a schematic cross-section of an ICP processing chamber according to another embodiment, designed to overcome radial-asymmetry. For example, in some designs the interior space of a chamber is not symmetric with respect to the central axis of a wafer that is being processed. Such designs may lead to asymmetric distribution of charged or neutral species, or both, in the plasma. Ion distribution may be controlled via RF power coupling; however, neutral species distribution is not affected by an RF power and is dependent more on the gas flow within the chamber. Therefore, according to embodiments of the invention, illustrated in FIG. 7, a baffle 772 is designed to alter the gas flow so as to control the flow of the neutral species.

As illustrated in FIG. 7, the baffle 772 is provided with a wall 773, which extends upwards from a baffle plate 771. That is, the wall 773 extends from the plate 771 in a direction away from the wafer and towards the ceiling of the chamber. The gas is injected between the ceiling and the baffle 772, such that the wall 773 forms a barrier to the gas flow. However, as shown by the examples provided in callouts A-C, the barrier is radially uneven, such that it enables higher gas flow at some radial location than in other radial locations. This may be achieved in various manners, but specific examples are provided in callouts A-C.

In the example illustrated in callout A, the wall 773 is made uneven. That is, a height $h_1$ is shown to be higher than a height $h_2$ at the opposite side of the wall. Of course, the minimum and maximum heights need not necessarily be on opposite sides. Rather, at the area where higher flow is needed, the height should be lower. Also, while in callout A the height is changed gradually, this is not a requirement. Rather, the height can be changed abruptly such as, e.g., using a step-wise design.

Alternatively, as illustrated in callout B, holes may be provided on wall 773 to allow the control of the flow. In callout B the distribution of the holes is made uneven to generate uneven gas flow. Specifically, in callout B more holes are made on the left side than the right side. However, alternatively or in addition, the sizes or shapes of the holes can be changed to cause uneven distribution, as illustrated in callout C.

Figure 8:
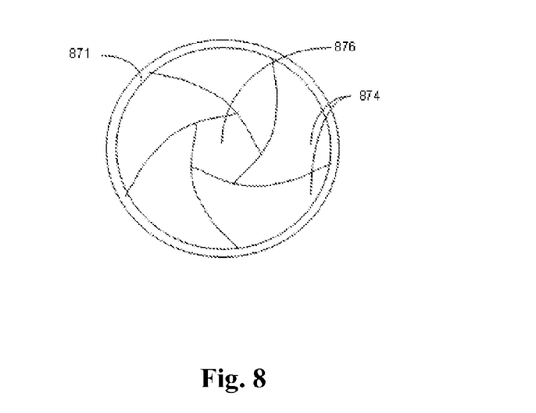
FIG. 8 is a schematic of a baffle according to an embodiment having a variable opening diameter.

In the embodiments described above the resulting gas distribution is static, i.e., once the baffle is placed within the chamber it provides a specific gas distribution that cannot be changed without disassembling the chamber or replacing the baffle. However, at times it is desirable to change the flow characteristics of the chamber without having to disassemble the chamber. Therefore, according to other embodiments the aperture of the baffle is made variable without having to disassemble the chamber. This can be achieved in different ways, but one example is provided in FIG. 8. The baffle of FIG. 8 has a rotatable ring 871 which may be rotated from the outside of the chamber either manually or mechanically using, e.g. stepper motors. When the ring 871 is rotated it activates leafs or blades 874, which act like a camera iris to vary the size of the aperture 876.

It should be understood that processes and techniques described herein are not inherently related to any particular apparatus and may be implemented by any suitable combination of components. Further, various types of general purpose devices may be used in accordance with the techniques described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples are considered as exemplary only, with a true scope and spirit of the invention to be indicated by the following claims.

What is claimed is:

1. A plasma reactor comprising:
    an enclosure having a sidewall and a ceiling forming a dielectric window;
    a substrate support positioned within the enclosure below the dielectric window;
    an RF power applicator positioned above the dielectric window to radiate RF power into the enclosure;
    a plasma gas injector arrangement to supply plasma gas into the enclosure; and,
    a baffle situated inside the enclosure and positioned above the substrate support but below the plasma gas injector arrangement so as to radially unevenly restrict flow of the plasma gas;
    wherein the baffle comprises a plate extending radially to the sidewall and having a central aperture and a wall extending from the central aperture upwards towards the coil form a barrier to gas flow, wherein the barrier is radially uneven.

2. The plasma reactor of claim 1, wherein the wall extending from the plate upwards towards the ceiling is orthogonal to the plate.

3. The plasma reactor of claim 2, wherein the wall has different heights at different radial locations.

4. The plasma reactor of claim 2, wherein the central aperture has an aperture diameter equal to a diameter of a substrate.

5. The plasma reactor of claim 1, wherein the wall has a plurality of holes distributed radially.

6. The plasma reactor of claim 5, wherein the distribution of the holes is radially uneven.

7. The plasma reactor of claim 5, wherein the holes are of different sizes.

8. The plasma reactor of claim 5, wherein the holes have different shapes.

* * * * *